(12) United States Patent
Brunner et al.

(10) Patent No.: US 7,847,566 B2
(45) Date of Patent: Dec. 7, 2010

(54) CONFIGURABLE PROBER FOR TFT LCD ARRAY TEST

(75) Inventors: Matthias Brunner, Kirchcheim (DE); Shinichi Kurita, San Jose, CA (US); Ralf Schmid, Poin (DE); Fayez (Frank) E. Abboud, Pleasanto, CA (US); Benjamin Johnston, Los Gatos, CA (US); Paul Bocian, Saratoga, CA (US); Emanuel Beer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 147 days.

(21) Appl. No.: 11/940,432

(22) Filed: Nov. 15, 2007

(65) Prior Publication Data

US 2008/0061807 A1  Mar. 13, 2008

Related U.S. Application Data

(63) Continuation of application No. 10/889,695, filed on Jul. 12, 2004, now Pat. No. 7,319,335, which is a continuation-in-part of application No. 10/778,982, filed on Feb. 12, 2004, now Pat. No. 6,833,717.

(51) Int. Cl.
    *G01R 31/26* (2006.01)
(52) U.S. Cl. .................................. 324/751; 324/770
(58) Field of Classification Search .............. 324/158.1, 324/751–758, 765–770; 250/305–310
    See application file for complete search history.

(56) References Cited

U.S. PATENT DOCUMENTS

| | | | |
|---|---|---|---|
| 3,787,768 A | 1/1974 | Kubota et al. | |
| 3,843,256 A | 10/1974 | Fontana et al. | |
| 3,983,401 A | 9/1976 | Livesay | |
| 4,090,056 A | 5/1978 | Lockwood et al. | |
| 4,362,945 A | 12/1982 | Riecke et al. | |
| 4,437,044 A | 3/1984 | Veith et al. | |
| 4,471,298 A | 9/1984 | Frohlich | |
| 4,495,966 A | 1/1985 | Longamore | |
| 4,528,452 A | 7/1985 | Livesay | |
| 4,532,423 A | 7/1985 | Tojo et al. | |
| 4,684,808 A | 8/1987 | Plies et al. | |
| 4,725,736 A | 2/1988 | Crewe | |

(Continued)

FOREIGN PATENT DOCUMENTS

DE  3636316  4/1987

(Continued)

OTHER PUBLICATIONS

German Search Report, dated Jul. 18, 2003 for DE 102 53 717.8 9 (ZIMR/0005).

(Continued)

*Primary Examiner*—Minh N Tang
*Assistant Examiner*—Trung Q Nguyen
(74) *Attorney, Agent, or Firm*—Patterson & Sheridan, LLP

(57) ABSTRACT

A method of testing electronic devices on substrates is described. The method includes placing a configurable prober over a first substrate, testing the first substrate, re-configuring the configurable prober, placing the configurable prober over a second substrate, and testing the second substrate.

5 Claims, 8 Drawing Sheets

U.S. PATENT DOCUMENTS

| | | |
|---|---|---|
| 4,740,705 A | 4/1988 | Crewe |
| 4,760,567 A | 7/1988 | Crewe |
| 4,761,607 A | 8/1988 | Shiragasawa et al. |
| 4,764,818 A | 8/1988 | Crew |
| 4,795,912 A | 1/1989 | Maschke |
| 4,818,933 A | 4/1989 | Kerschner et al. |
| 4,819,038 A | 4/1989 | Alt |
| 4,843,312 A | 6/1989 | Hartman et al. |
| 4,862,075 A | 8/1989 | Choi et al. |
| 4,870,357 A | 9/1989 | Young et al. |
| 4,899,105 A | 2/1990 | Akiyama et al. |
| 4,965,515 A | 10/1990 | Karasawa et al. |
| 4,983,833 A | 1/1991 | Brunner et al. |
| 4,985,676 A | 1/1991 | Karasawa et al. |
| 4,985,681 A | 1/1991 | Brunner et al. |
| 5,003,254 A | 3/1991 | Hunt et al. |
| 5,081,687 A | 1/1992 | Henley et al. |
| 5,107,206 A | 4/1992 | Yanagi et al. |
| 5,124,635 A | 6/1992 | Henley |
| 5,170,127 A | 12/1992 | Henley |
| 5,175,495 A | 12/1992 | Brahme et al. |
| 5,177,437 A | 1/1993 | Henley |
| 5,220,285 A | 6/1993 | Cerda et al. |
| 5,258,706 A | 11/1993 | Brunner et al. |
| 5,268,638 A | 12/1993 | Brunner et al. |
| 5,278,494 A | 1/1994 | Obigane et al. |
| 5,285,150 A | 2/1994 | Henley et al. |
| 5,313,156 A | 5/1994 | Klug et al. |
| 5,368,676 A | 11/1994 | Nagaseki et al. |
| 5,369,359 A | 11/1994 | Schmitt et al. |
| 5,371,459 A | 12/1994 | Brunner et al. |
| 5,414,374 A | 5/1995 | Brunner et al. |
| 5,430,292 A | 7/1995 | Honjo et al. |
| 5,432,461 A | 7/1995 | Henley |
| 5,504,438 A | 4/1996 | Henley |
| 5,528,158 A | 6/1996 | Sinsheimer et al. |
| 5,530,370 A | 6/1996 | Langhof et al. |
| 5,558,717 A | 9/1996 | Zhao et al. |
| 5,621,333 A | 4/1997 | Long et al. |
| 5,644,245 A | 7/1997 | Saitoh et al. |
| 5,657,139 A | 8/1997 | Hayashi et al. |
| 5,691,764 A | 11/1997 | Takekoshi et al. |
| 5,742,173 A | 4/1998 | Nakagomi et al. |
| 5,774,100 A | 6/1998 | Aoki et al. |
| 5,801,545 A | 9/1998 | Takekoshi et al. |
| 5,801,764 A | 9/1998 | Koizumi et al. |
| 5,834,007 A | 11/1998 | Kubota et al. |
| 5,834,773 A | 11/1998 | Brunner et al. |
| 5,892,224 A | 4/1999 | Nakasuji et al. |
| 5,923,180 A | 7/1999 | Botka et al. |
| 5,930,607 A | 7/1999 | Satou et al. |
| 5,936,687 A | 8/1999 | Lee et al. |
| 5,973,323 A | 10/1999 | Adler et al. |
| 5,982,190 A | 11/1999 | Toro-Lira |
| 6,033,281 A | 3/2000 | Toro-Lira |
| 6,046,599 A | 4/2000 | Long et al. |
| 6,075,245 A | 6/2000 | Toro-Lira |
| 6,086,362 A | 7/2000 | White et al. |
| 6,137,303 A | 10/2000 | Deckert et al. |
| 6,145,648 A | 11/2000 | Teichman et al. |
| 6,198,299 B1 | 3/2001 | Hollman |
| 6,265,889 B1 | 7/2001 | Tomita et al. |
| 6,281,701 B1 | 8/2001 | Yang et al. |
| 6,288,561 B1 | 9/2001 | Leedy |
| 6,297,656 B1 | 10/2001 | Kobayashi et al. |
| 6,320,568 B1 | 11/2001 | Zavracky |
| 6,333,635 B1 | 12/2001 | Lee et al. |
| 6,337,722 B1 | 1/2002 | Ha et al. |
| 6,337,772 B2 | 1/2002 | Uehara et al. |
| 6,340,963 B1 | 1/2002 | Anno et al. |
| 6,343,369 B1 | 1/2002 | Saunders et al. |
| 6,356,098 B1 | 3/2002 | Akram et al. |
| 6,362,013 B1 | 3/2002 | Yoshimura et al. |
| 6,380,729 B1 | 4/2002 | Smith |
| 6,435,868 B2 | 8/2002 | White et al. |
| 6,450,469 B1 | 9/2002 | Okuno et al. |
| 6,501,289 B1 | 12/2002 | Takekoshi et al. |
| 6,528,767 B2 | 3/2003 | Bagley et al. |
| 6,559,454 B1 | 5/2003 | Murrell et al. |
| 6,566,897 B2 | 5/2003 | Lo et al. |
| 6,570,553 B2 | 5/2003 | Hashimoto et al. |
| 6,677,771 B2 * | 1/2004 | Zhou et al. ............ 324/758 |
| 6,730,906 B2 | 5/2004 | Brunner et al. |
| 6,765,203 B1 | 7/2004 | Abel |
| 6,777,675 B2 | 8/2004 | Parker et al. |
| 6,828,587 B2 | 12/2004 | Yamazaki et al. |
| 6,833,717 B1 | 12/2004 | Kurita et al. |
| 6,873,175 B2 | 3/2005 | Toro-Lira et al. |
| 6,961,490 B2 | 11/2005 | Maisenhoelder et al. |
| 6,992,290 B2 | 1/2006 | Watanabe et al. |
| 6,995,576 B2 | 2/2006 | Imai et al. |
| 7,005,641 B2 | 2/2006 | Nakasuji et al. |
| 7,077,019 B2 | 7/2006 | Weiss et al. |
| 7,084,970 B2 | 8/2006 | Weiss et al. |
| 7,088,117 B2 | 8/2006 | Uher et al. |
| 7,116,119 B2 * | 10/2006 | Sporck et al. ............ 324/754 |
| 7,137,309 B2 | 11/2006 | Weiss et al. |
| 7,180,084 B2 | 2/2007 | Weiss et al. |
| 7,319,335 B2 | 1/2008 | Brunner et al. |
| 7,365,553 B2 * | 4/2008 | Garabedian et al. ...... 324/758 |
| 7,368,930 B2 * | 5/2008 | Hobbs et al. ............ 324/758 |
| 7,482,822 B2 * | 1/2009 | Cooper et al. ............ 324/754 |
| 2001/0052788 A1 | 12/2001 | Tomita |
| 2002/0024023 A1 | 2/2002 | Brunner et al. |
| 2002/0034888 A1 | 3/2002 | Edwards et al. |
| 2002/0047838 A1 | 4/2002 | Aoki et al. |
| 2003/0209323 A1 | 11/2003 | Yokogaki |
| 2003/0218456 A1 | 11/2003 | Brunner et al. |
| 2004/0145383 A1 | 7/2004 | Brunner |
| 2005/0040338 A1 | 2/2005 | Weiss et al. |
| 2005/0066898 A1 | 3/2005 | Schmitt et al. |
| 2005/0179451 A1 | 8/2005 | Brunner et al. |
| 2006/0038554 A1 | 2/2006 | Kurita et al. |

FOREIGN PATENT DOCUMENTS

| | | |
|---|---|---|
| DE | 19832297 | 1/1999 |
| EP | 0204855 | 12/1986 |
| EP | 0370276 | 5/1990 |
| EP | 0402499 | 12/1990 |
| EP | 0523584 | 1/1993 |
| EP | 0523594 | 1/1993 |
| EP | 0537505 | 4/1993 |
| EP | 0542094 | 5/1993 |
| EP | 0614090 | 9/1994 |
| EP | 0762137 | 3/1997 |
| EP | 0806700 | 11/1997 |
| EP | 0932182 | 7/1999 |
| EP | 0999573 | 5/2000 |
| EP | 1045425 | 10/2000 |
| EP | 1045426 | 10/2000 |
| EP | 1233274 | 8/2002 |
| JP | 60039748 | 3/1985 |
| JP | 6388741 | 4/1988 |
| JP | 6388742 | 4/1988 |
| JP | 63166132 | 7/1988 |
| JP | 63318054 | 12/1988 |
| JP | 1213944 | 8/1989 |
| JP | 1307148 | 12/1989 |
| JP | 6167538 | 6/1994 |
| JP | 7302563 | 11/1995 |
| JP | 8173418 | 7/1996 |
| JP | 8289231 | 11/1996 |
| JP | 11264940 | 9/1999 |

| | | |
|---|---|---|
| JP | 2000180392 | 6/2000 |
| JP | 2000223057 | 8/2000 |
| JP | 2000268764 | 9/2000 |
| JP | 20010033408 | 2/2001 |
| JP | 2001318116 | 11/2001 |
| JP | 2001358189 | 12/2001 |
| JP | 2002039976 | 2/2002 |
| JP | 2002048740 | 2/2002 |
| JP | 2002257997 | 9/2002 |
| JP | 2002310959 | 10/2002 |
| JP | 2002343294 | 11/2002 |
| JP | 2004014402 | 1/2004 |
| TW | 344876 | 11/1998 |
| TW | 427551 | 3/2001 |
| TW | 459140 | 10/2001 |
| TW | 473772 | 1/2002 |
| TW | 512428 | 1/2002 |
| TW | 511207 | 11/2002 |
| TW | 536630 | 6/2003 |
| TW | 541430 | 7/2003 |
| TW | 200301535 | 7/2003 |
| WO | WO-9209900 | 6/1992 |
| WO | WO-9831050 | 7/1998 |
| WO | WO-9923684 | 5/1999 |
| WO | WO-9960614 | 11/1999 |
| WO | WO-0233745 | 4/2002 |
| WO | WO-0245137 | 6/2002 |
| WO | WO-03102679 | 12/2003 |

OTHER PUBLICATIONS

German Examination Report, dated Jul. 14, 2003 for DE 102 53 717.8 (ZIMR/0005).
European Search Report, dated Apr. 5, 2004 for EP 030 26 267.9 (ZIMR/0005).
PCT International Search Report & Written Opinion for PCT/US2004/043202, dated Jul. 28, 2005 (APPM/008500.PCT).
Brunner, et al., "Development of Puma 5500/10K Platform", AKTNews, vol. 5, Jan. 2001, p. 13-14.
Brunner, M., "TFT Array Testing: Replacing Mechanics by Electron Beam Deflection," AKTNews vol. 6, Apr. 2001, p. 15-17.
Invitation to Pay Additional Fees dated Oct. 21, 2003 for corresponding PCT application, PCT/US03/15903. (AMAT/7356/PCT).
PCT International Serch Report for PCT/US03/15903, dated Jan. 16, 2004. (AMAT/7356PCT).
PCT English Translation of International Preliminary Exam Report for PCT/EP03/06481, dated Mar. 10, 2005. (ZIMR/0014).
Kumada, et al., "Non-Contact Array testers".
Invitation to Pay Additional Fees for PCT/US04/043202 dated May 11, 2005.
U.S. Appl. No. 10/778,982, filed Feb. 12, 2004, Shinichi Kurita, et al., "Electron Beam Test System With Integrated Substrate Transfer Module."
U.S. Appl. No. 10/903,216, filed Jul. 30, 2004, Matthias Brunner, et al., "Configurable Proper For TFT LCD Array Test."
International Search Report for PCT/US05/26866, dated Aug. 30, 2006 (APPM/008500.PCT.03).
TIPO Official Action for Patent Application No. 94123638, dated Dec. 25, 2006 (APPM/008500TAIW02).
L. Kyung-ha, "A Study on Laser Annealed Polycrystalline Silicon Thin Film Transistors (TFT's) with SiNx Gate Insulator," Kyung Hee University, Ch. 2 & 4 (1998).
S.K. Kim, et al. "A Novel Self-Aligned Coplanar Amorphous Silicon Thin Film Tmsistor," ISSN0098-0966X/98/2901 (1998).
M.A. Lieberman, et al. "Standing Wave and Skin Effects in Large-Area, High-Frequency Capacitive Discharges" Plasma Sources Sci. Technology, vol. 11, pp. 283-293 (2002).
Y. Park, "Bulk and Interface Properties of Low-Temperature Silicon Nitride Films Deposited by Remote Plasma Enhanced Chemical Vapor Deposition," Journal of Material Science: Materials in Electronics, vol. 12, pp. 515-522 (2001).
A. Sazonov, et al. "Low Temperature a-Si:H TFT on Plastic Films: Materials and Fabrication Aspects," Proc. 23rd International Conference on Microelectronics (MIEL 2002), vol. 2, Nis, Yugoslavia (May 2002).
D.B. Thomasson, et al. "High Mobility Tri-Layer a-Si:H Thin Film Transistors with Ultra-Thin Active Layer," (1997) Society of Information Display International Symposium Digest of Technical Papers, vol. 28, pp. 176-179.
Yue Kuo, "Plasma Enhanced Chemical Vapor Deposition Silicon Nitride as a Gate Dielectric Film for Amorhous Silicon Thin Film Transistors—A Critical Review" Vacuum, vol. 51, No. 4, pp. 741-745, Elsevier Science Ltd. (1998).
International Search Report for PCT/US2005/012832, mailed Aug. 11, 2005.
Korean Office Action for Application No. 10/2004-0108843, dated Aug. 29, 2006 (AMAT/9162.KR).
Third Party Submission for Korean Application No. 10-2004-0108843, dated Nov. 2006. (AMAT/9162.KR).
Lee, et al. "High Density Hollow Cathode Plasma Etching for Field Emission Display Applications" Journal of Information Display vol. 2, No. 4 (2002) pp. 1-7.
Anders, et al. "Working Principle of the Hollow-Anode Plasma Source" Lawrence Berkeley National Laboratory, USB pp. 1-10.
Anders, et al. "Characterization of a Low-Energy Constricted-Plasma Source" Ernest Orlando Lawrence Berkeley National Laboratory & Institute of Physics, Germany (Aug. 1997) pp. 1-11.
"13.56 MHz Hollow Cathode Plasma Source HCD-P 100" Plasma Consult Germany—Technical Note.
"13.56 MHz Hollow Cathode Plasma Source HCD-L 300" Plasma Consult Germany—Technical Note.
European Search Report for EP 05000831.7-2122, dated Feb. 8, 2006 (9162.EP).
L. Bardos, et al. "Thin Film Processing by Radio Frequency Hollow Cathodes," Surface and Coatings Technology (1997), pp. 723-728.
Park, K.J., "Bulk and Interface Charge in Low Temperature Silicon Nitride for Thin Film Transistors on Plastic Substrates," Journal Vacuum Science Technology, A22(6), Nov./Dec. (2004), pp. 2256-2260.
First Office Action issued by the Patent Office of the State Intellectual Property Office of The People's Republic of China for Application No. 200510084720.1, dated Dec. 7, 2007 (8500CN02 ).

* cited by examiner

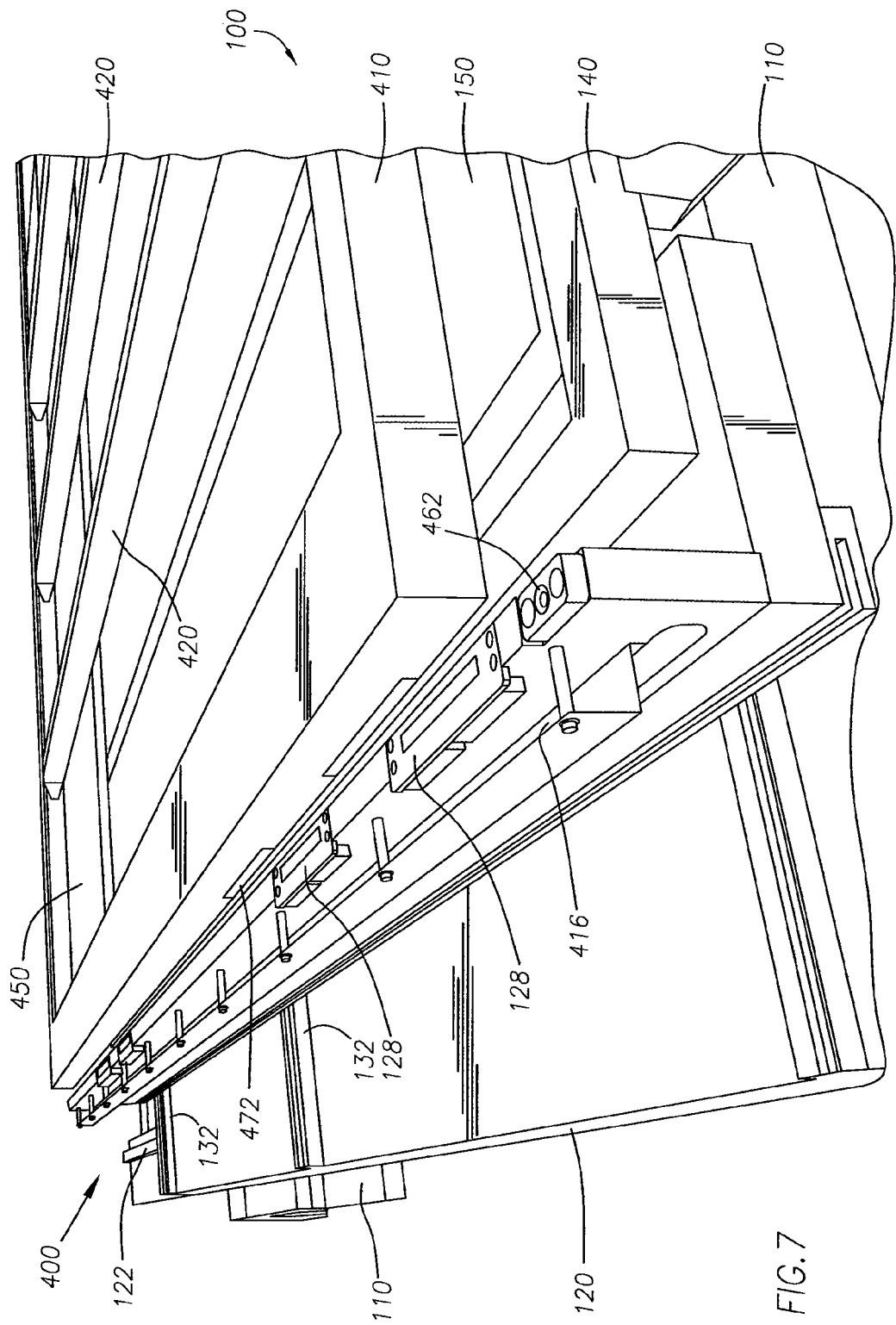

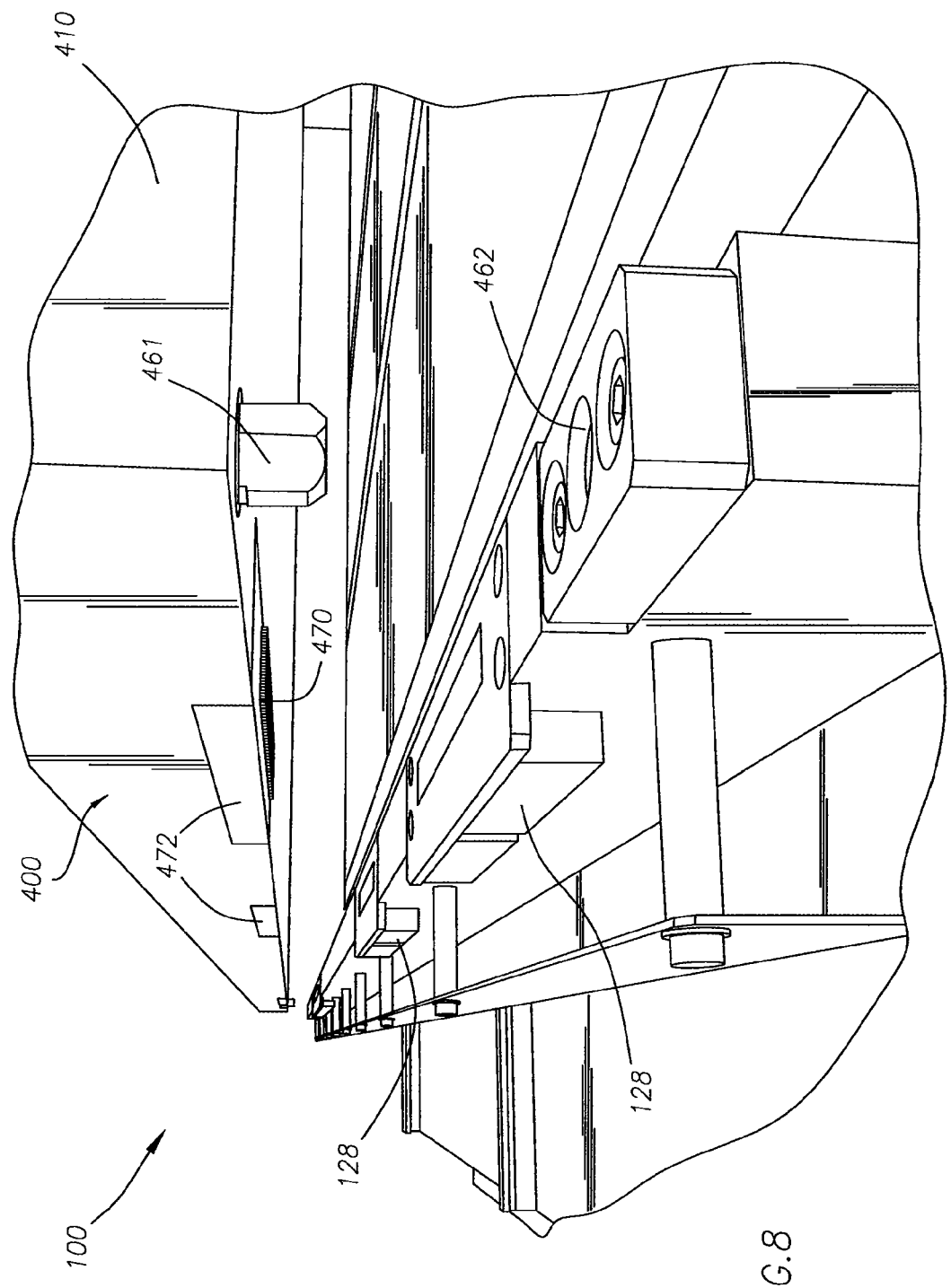

CONFIGURABLE PROBER FOR TFT LCD ARRAY TEST

CROSS-REFERENCE TO RELATED APPLICATIONS

This application is a continuation of U.S. patent application Ser. No. 10/889,695, filed Jul. 12, 2004, now U.S. Pat. No. 7,319,335 which is a continuation-in-part of U.S. patent application Ser. No. 10/778,982, filed Feb. 12, 2004, and issued on Dec. 21, 2004 as U.S. Pat. No. 6,833,717, both of which are incorporated by reference herein in their entirety.

BACKGROUND OF THE INVENTION

1. Field of the Invention

Embodiments of the present invention generally relate to electron beam testing systems for semiconductor devices on substrates. More particularly, embodiments of the present invention generally relate to an improved prober for conducting a thin film transistor liquid crystal display array test on a variety of glass panel substrate designs.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD comprises two glass plates having a layer of liquid crystal materials sandwiched therebetween. One of the glass plates typically includes a conductive film disposed thereon. The other glass plate typically includes an array of thin film transistors (TFTs) coupled to an electrical power source. Each TFT may be switched on or off to generate an electrical field between a TFT and the conductive film. The electrical field changes the orientation of the liquid crystal material, creating a pattern on the LCD.

The demand for larger displays, increased production and lower manufacturing costs has created a need for new manufacturing systems that can accommodate larger substrate sizes. Current TFT LCD processing equipment is generally configured to accommodate substrates up to about 1.5×1.8 meters. However, processing equipment configured to accommodate substrate sizes up to and exceeding 1.9×2.2 meters is envisioned in the immediate future. Therefore, the size of the processing equipment as well as the process throughput time is a great concern to TFT LCD manufacturers, both from a financial standpoint and a design standpoint.

In order to provide quality control for thin film transistors on a large area glass substrate, it is desirable to conduct a liquid crystal display "array test." The array test allows a TFT LCD manufacturer to monitor and correct defects in the pixels during processing. A known method of testing pixels is known as electron beam testing, or "EBT." During testing, each TFT is positioned under an electron beam. This is accomplished by positioning a substrate on a table positioned below the beam, and moving the table in "x" and "y" directions to sequentially position each TFT on the substrate below the electron beam test device. One such device which enables flat panel display fabricators to test devices formed on flat panels is a PUMA™ electron beam tester available from AKT, Inc., a division of Applied Materials, Inc. located in Santa Clara, Calif.

In order for the LCD array test to be conducted, a "prober" is used. A typical prober consists of a frame that usually covers the entire substrate under investigation. The frame has a plurality of pogo pins thereon at locations that match the contact pads of the substrate. Electrical connection to the pogo pins is accomplished by fine wire connections to an electronics driver board. The board is usually software controlled.

In operation, the substrate is raised into contact with the prober. More specifically, the contact pads of the substrate are placed into contact with the pogo pins of the prober. The contact pads, in turn, are in electrical communication with a pre-defined set of the thin film transistors, or "pixels." An electrical current is delivered through the pogo pins and to the contact pads. The current travels to and electrically excites the corresponding pixels. An electron beam senses voltages in the excited pixels in order to confirm operability of the various thin film transistors on the substrate.

In the past, each prober has been custom made for a particular display layout design. This means that each semiconductor device and substrate layout has required a different prober having the matching configuration for the device array. The result is that the purchaser of semiconductor fabrication machinery must also purchase a compatible prober in order to test the fabricated pixels. Moreover, the customer may desire to purchase more than one prober to serve as a backup or to simultaneously test multiple substrates.

Modification of an individual prober for a new device layout is expensive. Therefore, it is desirable to provide a prober that is configurable to match a new device layout.

SUMMARY OF THE INVENTION

The present invention generally provides an improved apparatus and method for an electronic devices test system. The apparatus includes a prober, which operates to test electronic devices, such as pixels on a substrate. The prober is "configurable," meaning that it can be adapted for different device layouts and substrate sizes.

In one embodiment, a method of testing electronic devices on substrates is described. The method includes placing a configurable prober over a first substrate, testing the first substrate, re-configuring the configurable prober, placing the configurable prober over a second substrate, and testing the second substrate.

In another embodiment, a method of testing electronic devices on rectangular substrates is described. The method includes placing a configurable prober over a first rectangular substrate, adjusting the configurable prober based on a pattern of electronic devices on the first rectangular substrate, testing the first rectangular substrate, placing the configurable prober over a second rectangular substrate, re-configuring the configurable prober by an adjustment based on a pattern of electronic devices on the second rectangular substrate, and testing the second rectangular substrate.

In another embodiment, a method of testing electronic devices on rectangular substrates is described. The method includes placing a first rectangular substrate on a test table disposed below a plurality of testing columns, placing a configurable prober over the first rectangular substrate, adjusting the configurable prober based on a pattern of electronic devices on the first rectangular substrate, testing the first rectangular substrate, placing a second rectangular substrate on the test table, placing the configurable prober over the second rectangular substrate, re-configuring the configurable prober by an adjustment based on a pattern of electronic devices on the second rectangular substrate, and testing the second rectangular substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a partial exploded view of the prober of FIG. 4. The prober is above the base for the device testing system. Controller pads for the testing system are seen.

FIG. 8 provides a further enlarged view of the electrical connection between the prober and the base for the device testing system.

DETAILED DESCRIPTION

The present invention generally provides an improved prober for an electronic devices test system. For purposes of this disclosure, the term "test system" means any system that may be used to test electronic devices on a substrate. Such a test system may include optical inspection systems, electron beam test systems, systems that detect color changes, and others. The prober for the electronic devices test system is "configurable," meaning that it can be adapted for different device layouts and substrate sizes.

Figure 1:
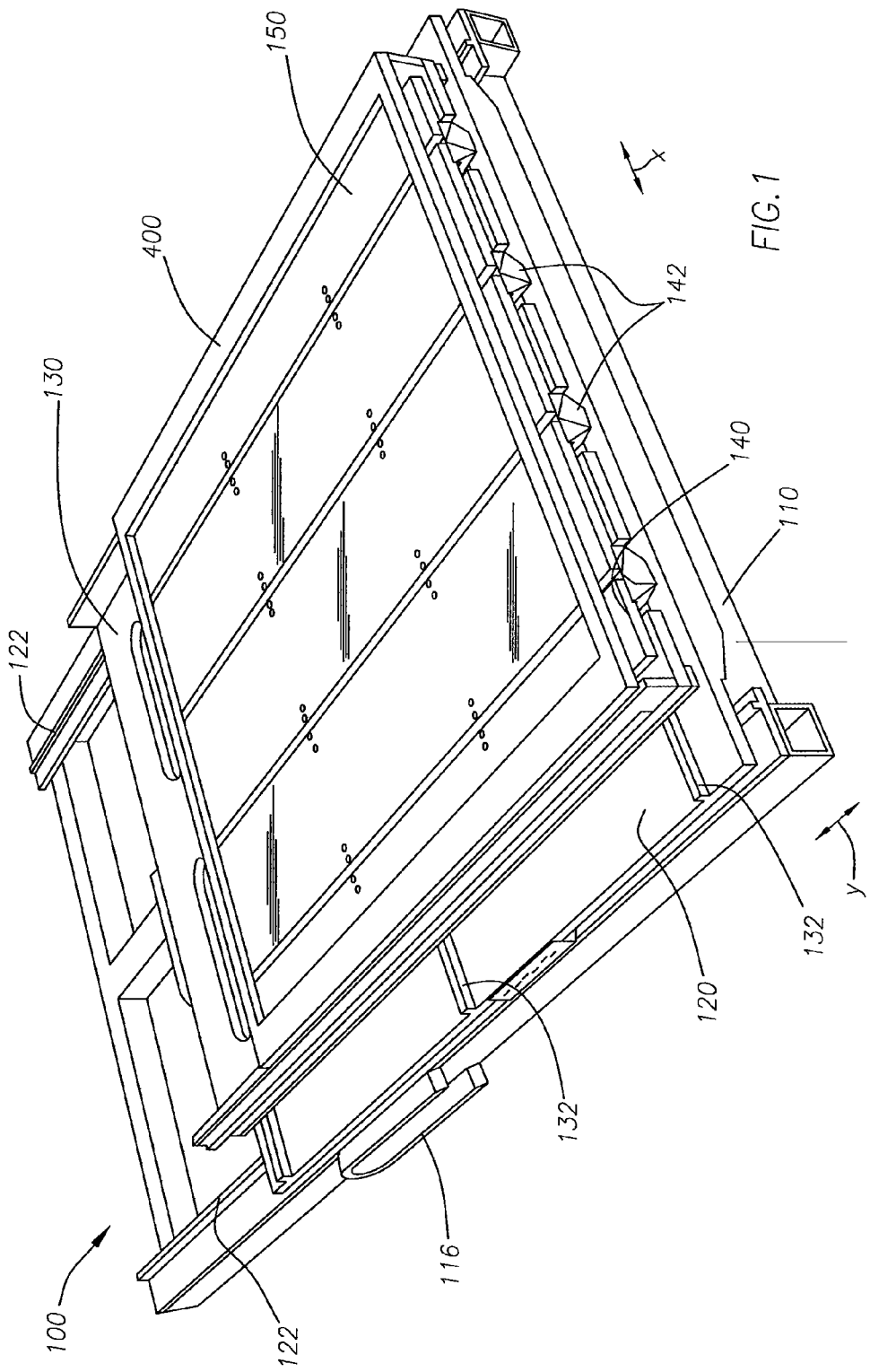
FIG. 1 presents a perspective view of a configurable prober, in one embodiment. The prober is part of an electronics device test system. The prober is positioned on a test system table that moves the prober in "x" and "y" directions.

FIG. 1 presents a perspective view of a configurable prober 400, in one embodiment. The prober 400 is part of an electronics device test system 100. In one embodiment, the prober 400 is part of an electron beam test system 100, though other systems could be used. The prober 400 is positioned on a test system table 110 that moves the prober 400 in at least "x" and "y" directions. In the arrangement of FIG. 1, the table 110 defines a tubular frame fabricated from stainless steel. However, the scope of the present inventions is not limited by the configuration or material of the table 110. An optional cable carrier 116 is provided external to the table 110.

The table 110 supports various plates 120, 130, 140 that translate the prober 400 in different dimensions. The three plates 120, 130, and 140 are planar monoliths or substantially planar monoliths, and are stacked on one another. The three stacked plates are seen in cross-section in FIG. 2, which is a cross-sectional view of the illustrative test system 100 of FIG. 1.

In one aspect, each of the three plates 120, 130, 140 is independently movable along orthogonal axes or dimensions. The first plate supports the second 130 and third 140 plates, as well as the prober 400. The first plate moves the supported second 130 and third 140 plates along a "y" axis. FIG. 1 shows bearing surfaces 122, for moving the first plate 120. The linear bearing surfaces 122 are provided in the "y" axis for the first plate 120.

The second plate 130 supports the third plate 140, and moves the third plate 140 and prober 400 in an "x" axis. Linear bearing surfaces 132 are provided along the "x" axis for the second plate 130. The second plate 130 supports the prober 400 through a collar 135.

Finally, the third plate 140 supports the substrate. A substrate is shown at 150 in FIGS. 1 and 2. The third plate 140 moves the substrate 150 in a "z" axis. More specifically, the third plate 140 lifts the substrate 150 into contact with pogo pins (shown at 480 in FIG. 9) of the prober 400.

Figure 2:
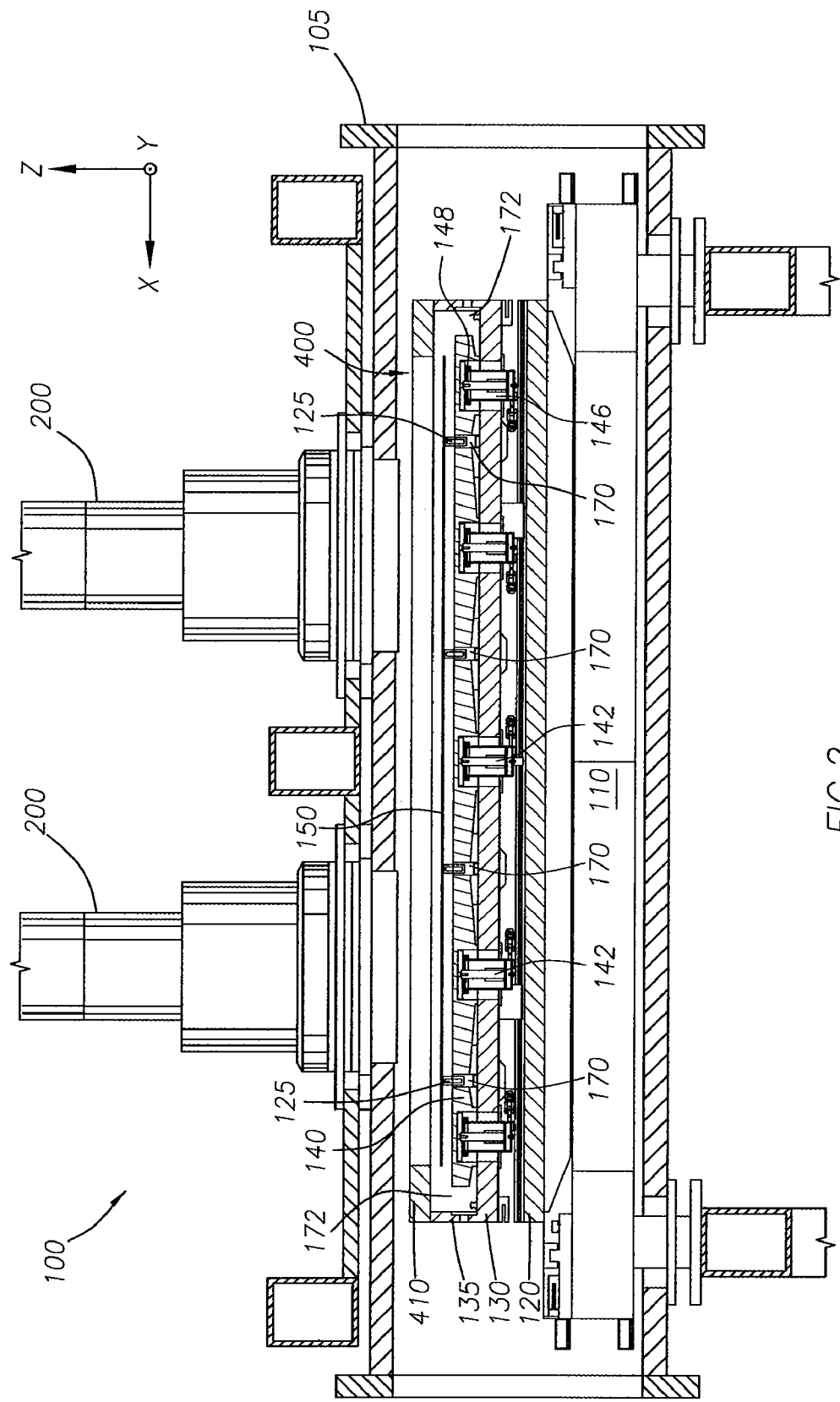
FIG. 2 is a cross-sectional view of an illustrative test system table. A prober is shown schematically on the table. In addition, electron beam test columns are seen over the prober. A substrate is placed between the test table and the prober.

As indicated, a substrate 150 is shown in FIGS. 1 and 2. The illustrative substrate 150 is a large area glass substrate that contains a plurality of conductive electronic devices. An example is a plurality of thin film transistors (TFT's). It is understood that the TFT's are quite small and will not be visible in the perspective view of the test system 100.

It is also understood that the test system 100 contains numerous other features and components. Where the test system is an electron beam test system, the system 100 may include a prober transfer assembly, a load lock chamber, a testing chamber and, optionally, a prober storage assembly, for example. The testing chamber will have electron beam columns for directing electron beams down onto the pixels under inspection. These various features are not shown in FIG. 1; however, electron beam columns are seen at 200 in the cross-sectional view of FIG. 2. Details of an exemplary electron beam test system containing such features are disclosed in U.S. Pat. No. 6,833,717, which was previously incorporated by reference.

Referring again to FIG. 2, a cross-sectional view of the illustrative test system 100 of FIG. 1 is presented. The test system 100 again includes a test system table 110. The table 110 supports the first plate 120, the second plate 130, and the third plate 140. The first (or lower) plate 120 and the second (or intermediate) plate 130 each move linearly along a horizontal plane, but move in a direction orthogonal to one another. In contrast, the third (or upper lift) plate 140 moves in a vertical direction or the "z" direction. Plates 120, 130 are driven by a linear motor or other actuator. Linear actuators such as linear motors or hydraulic cylinder-and-piston arrangements (not shown) may be provided for translating the plates 120, 130.

The prober 400 is shown schematically on the table 110, supported by the plates 120, 130, 140. The plates 120, 130, 140 selectively translate the prober 400 in different dimensions. In the illustrative system 100, the prober 400 may be moved in "x," "y" directions. Operation of the test system 100 in order to move the prober 400 is described in U.S. Pat. No. 6,833,717, which was previously incorporated by reference. As noted above, U.S. Pat. No. 6,833,717, which was previously incorporated by reference, is referred to and incorporated by reference herein to the extent its disclosure is not inconsistent with the present disclosure. FIG. 2 is a duplication of FIG. 5 from U.S. Pat. No. 6,833,717, which was previously incorporated by reference. For this reason, discussion of the system 100 shown in FIG. 2 herein is limited.

It should be noted that the test system 100 further includes an end effector 170. A portion of the end effector is shown in cross-section in FIG. 2. The end effector 170 transfers the substrates 150 in and out of the testing chamber. In operation, the end effector 170 may be extended from the testing chamber into an adjoining chamber or system such as a load lock chamber (not shown) to load a substrate. Likewise, the end effector 170 having a substrate loaded thereon may be extended from the testing chamber into the load lock chamber to transfer the substrate 150 to the load lock chamber. A motion device, such as a linear actuator, a pneumatic cylinder, a hydraulic cylinder, a magnetic drive, or a stepper or servo motor, for example may be coupled to the end effector 170 to assist this transfer. In one aspect, the end effector 170 includes a pair of bearing blocks 172 that permit the end effector 170 to move into and out of the testing chamber. Additional features of the end effector and the transfer of substrates are provided in U.S. Pat. No. 6,833,717, which was previously incorporated by reference.

The end effector 170 cooperates with the third plate 140 during substrate transfer. In this respect, the third plate contains one or more z-axis lifts 142 coupled to the plate 140. Each z-axis lift 142 is disposed within a channel 146. A bellows 148 is arranged about each lift 142 to reduce particle contamination within the testing chamber. The z-axis lift 142 moves up and down vertically and may be actuated pneumatically or electrically. The bellows 148, in turn, compress and expand in response to the movement of the corresponding lifts 142. In the view of FIG. 2, the upper lift plate 140 is in its lowered position. The substrate 150 is resting on pins 125 on the "x" plate 130.

The illustrative test system 100 of FIG. 2 also shows electron beam testing (EBT) columns 200. In this view, one pair of columns 200 is shown. However, there will typically be two (or possibly more) pairs of EBT columns. The EBT columns 200 are disposed on an upper surface of a chamber housing 105 and are attached to the housing 105. The housing 105 provides a particle free environment and encloses the prober 400 and table 110.

Figure 3:
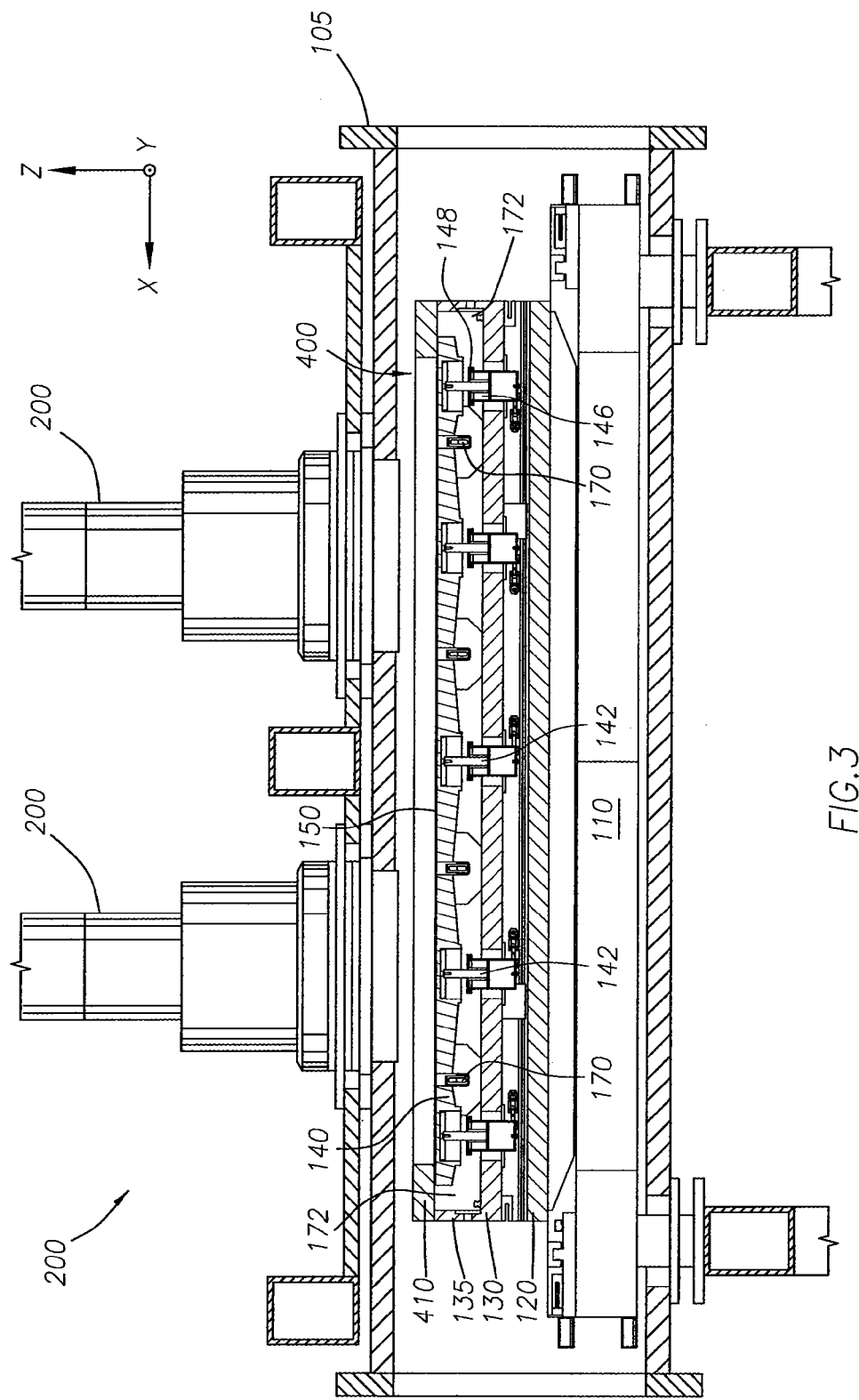
FIG. 3 shows the test system table of FIG. 2. In this view, the substrate has been raised into electrical contact with the prober.

FIG. 3 shows the test system 100 of FIG. 2 in a test position. Here, the z-axis lift 142 has been actuated to raise the substrate 150. It can be seen that the substrate 150 has been raised into contact with the prober 400. More specifically, contact is made between the substrate 150 and pogo pins (not shown) on a bottom face of the prober 400.

Figure 4:
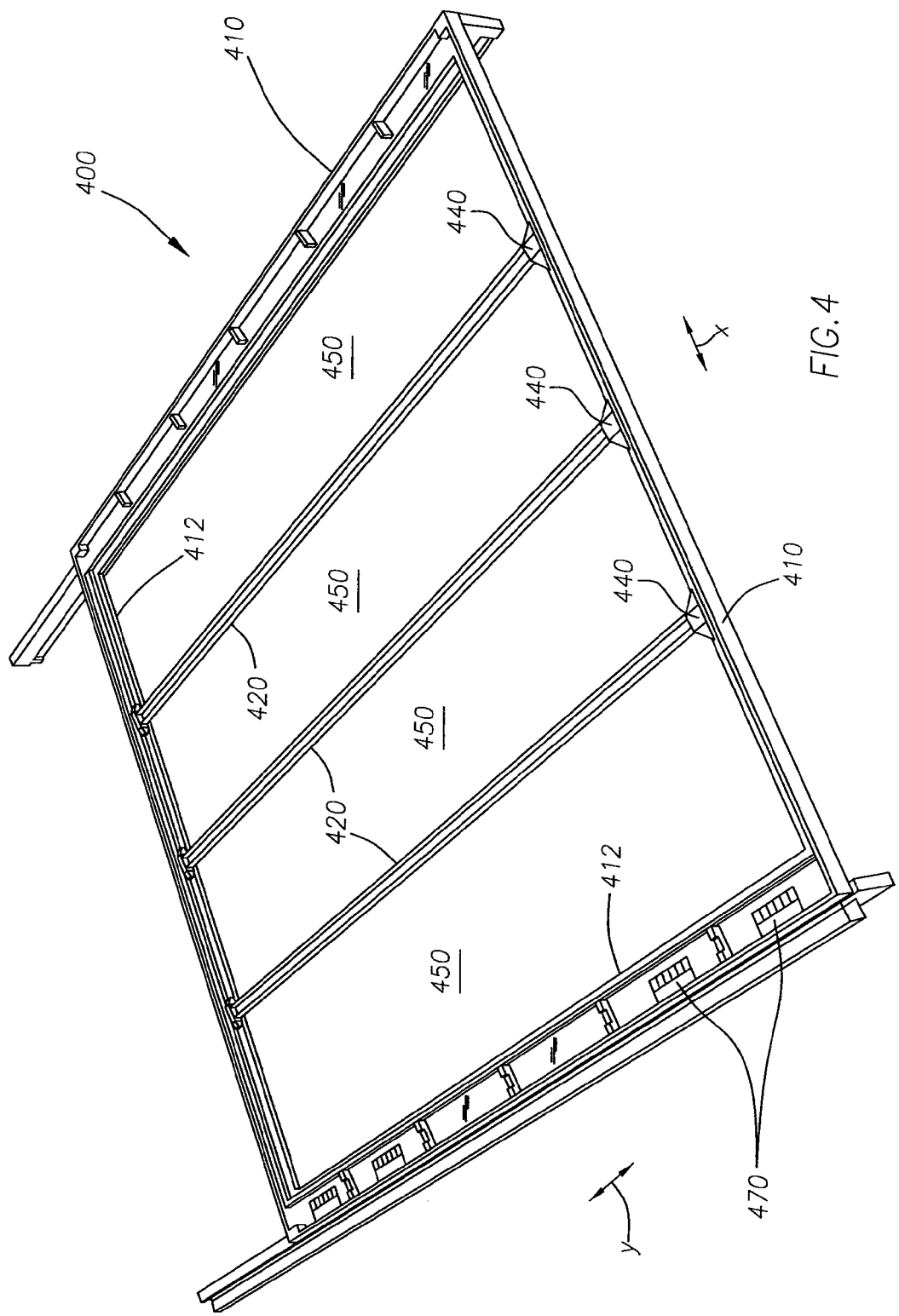
FIG. 4 presents a schematic view of a configurable prober, in one embodiment. Prober bars are shown within a universal frame in the "y" direction.

Moving now to FIG. 4, FIG. 4 presents a schematic view of a configurable prober 400, in one embodiment. The prober 400 has a frame 410. In the embodiment of FIG. 4, the frame 410 is a polygonal frame having four sides. In this particular arrangement, the frame is square, though other configurations may be provided such as rectangular. The frame 410 defines "x" and "y" directions or "axes."

The prober 400 also includes one or more prober bars 420. In the view of FIG. 4, three separate prober bars 420 are shown within the frame 410; however, other numbers of prober bars 420 may be employed. Each of these prober bars 420 is positioned at a selected coordinate along the "x" axis, and is parallel to the "y" axis. In this orientation, the prober bars 420 are "y" prober bars. The areas defined between the prober bars 420 form test areas 450 (seen also in FIG. 7).

The position of the prober bars 420 along the frame 410 may be changed. In this respect, the connection between the respective prober bars 420 and the frame 410 is releasable and relocatable. To provide for this feature, a frame connection mechanism 412 is provided that allows for ready relocation of at least one prober bar 420 to the frame 410 at a selected coordinate along the "x" or "y" axes of the frame. In one embodiment, the frame connection mechanism 412 is a plurality of through-holes placed along or formed within the inner surface of the frame 410. Exemplary through-holes are shown at 414 in the enlarged view of FIG. 5. The through-holes 414 receive end caps 440 placed at opposing ends of the prober bars 420.

Figure 6:
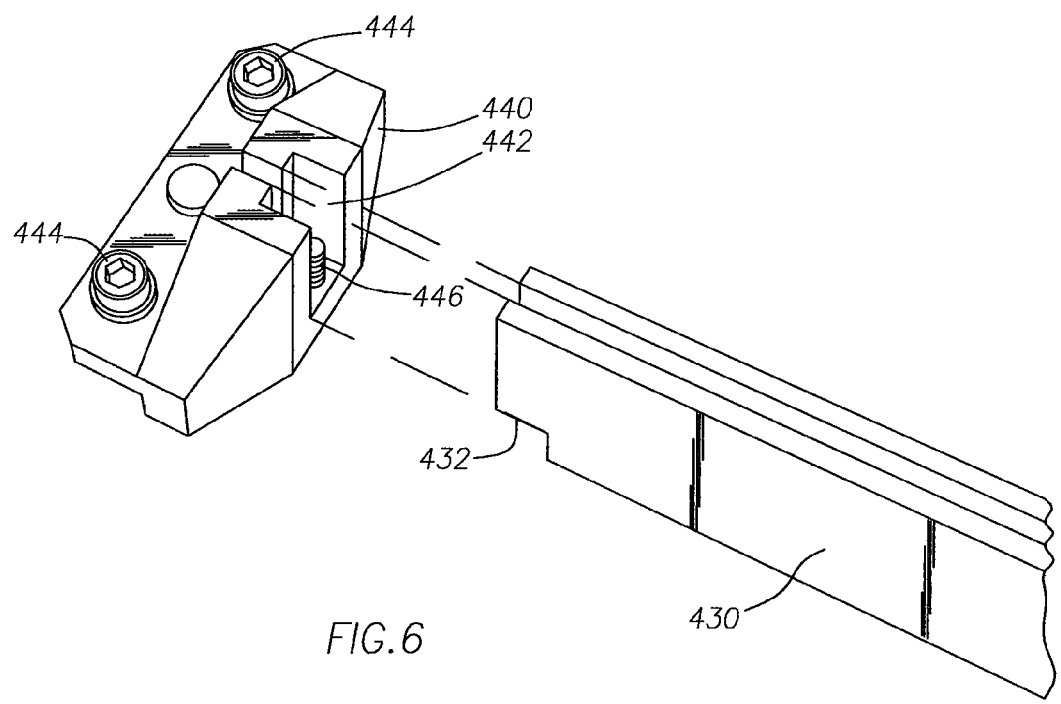
FIG. 6 shows the end cap of FIG. 5 exploded away from an "x" prober bar.

FIG. 6 provides a perspective view of an end cap 440. The end cap 440 is exploded away from an end of a prober bar 420. The end cap 440 includes one or more connecting members 444 for connecting to the frame connection mechanism 412 of the frame 410. In the end cap 440 arrangement of FIG. 6, a pair of bolts is provided as the connecting members 444. The end cap 440 also has a channel 442 for receiving a shoulder 432 on the prober bar 420. An optional bolt 446 is provided in the channel 442 of the end cap 440. The bolt 446 is configured to threadedly connect to the prober bar 420 through a threaded opening (not shown) formed on the prober bar 420.

In order to relocate a prober bar 420 along the frame 410, the bolts 444 are backed out of the holes 414 of the frame 410, and then advanced into different holes 414 located in the frame connection mechanism 412. In this manner, the position of the prober bars 420 along the "x" axis of the frame 410 may be adjusted. This, in turn, permits the user to employ the same prober 400 for different substrate sizes and for different device configurations.

Figure 5:
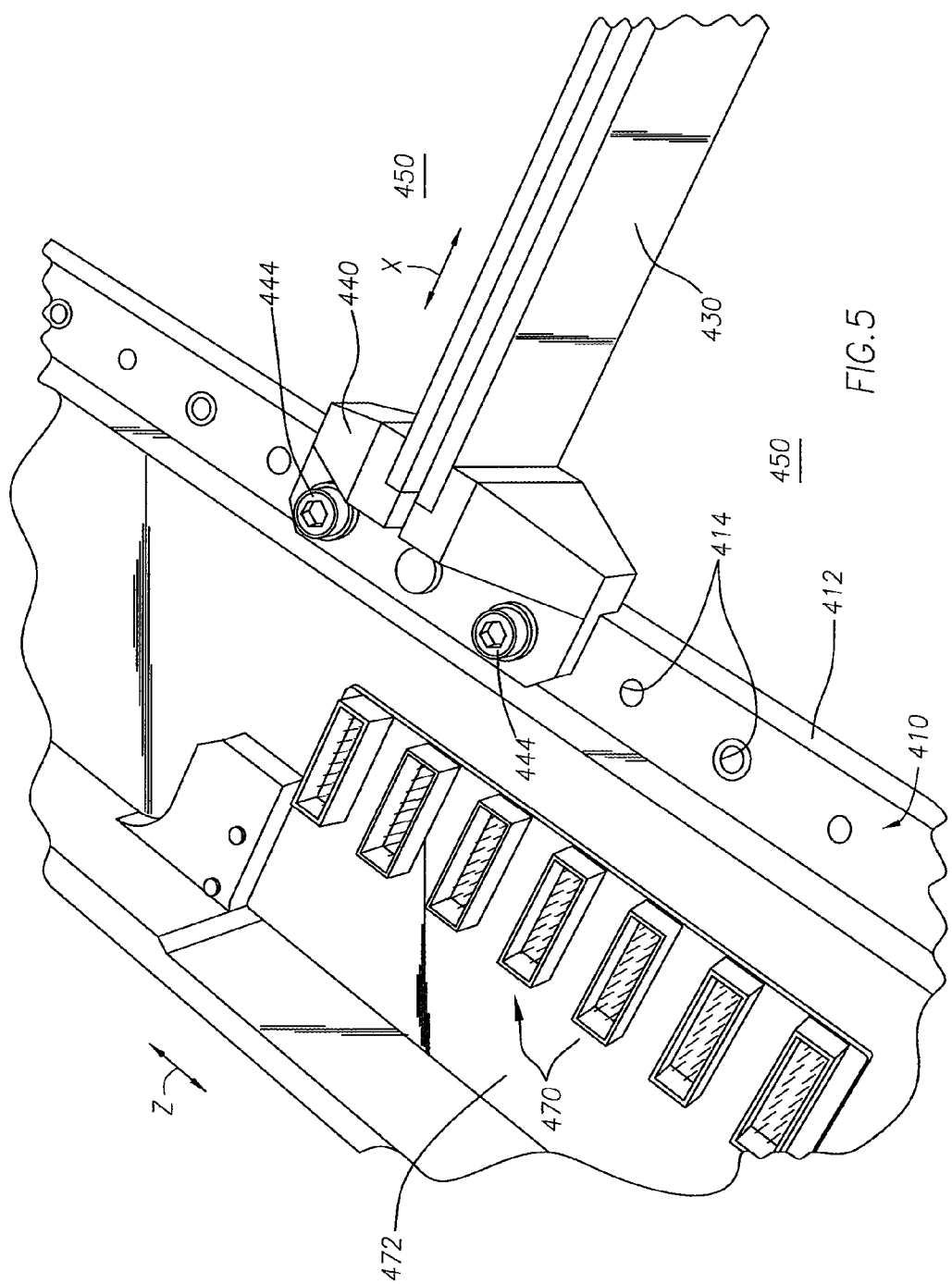
FIG. 5 provides a perspective view of a prober bar oriented along the "x" axis, with an end cap at an end of the prober bar. The end cap is connected to the frame.

In accordance with the present invention, prober bars 420 may also be positioned in the "x" direction of the prober frame 410, meaning that the prober bars are oriented parallel to the "x" axis. FIG. 5 provides an enlarged perspective view of a prober bar 430, with an end cap 440 at an end of the prober bar 420. The end cap 440 is again connected to the frame connection mechanism 412 of the frame 410. In this orientation, the prober bar is an "x" prober bar labeled as 430, and can be moved to a different position along the "y" axis. If the dimensions of the frame 410 are different in the "x" and "y" directions, then the lengths of the "x" and "y" prober bars 430, 420 will also be different.

As an additional option, "x" prober bars 430 may be placed between "y" prober bars 420, or between a "y" prober bar 420 and the frame 410 as shown in FIG. 4. In such an arrangement (not shown), a substantially shorter "x" prober bar would be employed.

The prober 400 has a plurality of electrical connection pads 472. The pads 472 are configured to place the frame 410 in electrical communication with the testing system 100. Each of the pads 472 has a plurality of "frame" pins 470 (seen in FIG. 8). FIG. 7 provides a perspective view of the prober 400 of FIGS. 1 and 4 as part of the test system 100. Pads 472 are aligned with mating pads 128 on the intermediate "x" plate 130. The mating pads 128 include printed circuit boards that interface with a controller (not shown) for the testing system 100. The pads 128 receive electrical signals that come from the controller and deliver them to the connected prober electrical connection pads 472. The detachable pin 470—pad 128 connection allows the prober 400 to be removed from the test system 100 for microscope operations and servicing. It is noted that the through-holes 414 in the frame 410 of FIG. 7 are not visible, as a cover has been temporarily placed on the prober frame 410. The cover is used during testing to shield the wires (not shown) that travel from pogo pins (shown at 480 in FIG. 9, and discussed below) to the printed circuit board 128. Without the cover, there is the potential that the E-Beam column 200 will charge up the wires. However, a cable channel for electrical connections is seen at 416 in FIG. 7.

FIG. 8 provides a further enlarged view of the prober 400 of FIG. 7. In this view, the electrical connection between the prober frame 410 and the test system 100 is more clearly seen. In this respect, electrical frame connection pads 472 are seen aligned over test system pads 128. In addition, an alignment pin 461 is seen at a corner of the prober frame 410. The alignment pin 461 is tapered so as to be guided into a locating seat 462 provided in the upper "x" plate 130. Bolts (not seen) secure the locating seat to the upper "ye" plate 140.

The frame electrical connection is done in such a way as to allow for a wide range of possible display layouts, such as from 25 to 1 display per sheet, and from 14" to about 50" display. More generally, the electrical connection is configurable for any display configuration that the prober frame size will accommodate.

Figure 9:
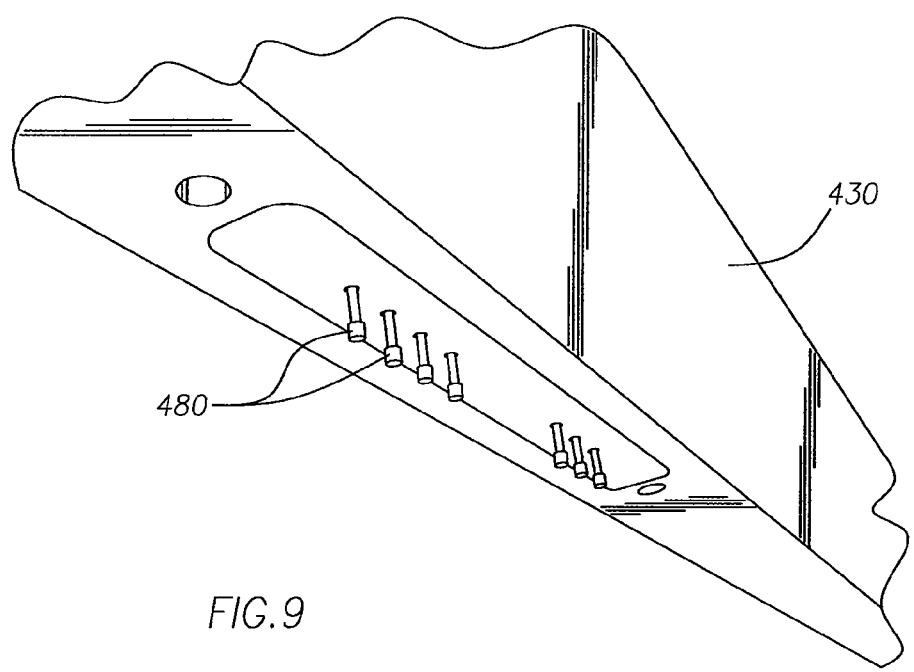
FIG. 9 presents a bottom view of an exemplary prober bar. A plurality of electrical contact pins are seen extending from the prober bar.

The prober 400 also has a plurality of electrical contact pins, or "pogo" pins 480. These pogo pins 480 are placed along each of the prober bars 420, 430. FIG. 9 presents a bottom view of an exemplary prober bar 430. A plurality of electrical contact "pogo" pins 480 are seen extending from the prober bar 430. While the pogo pins 480 are shown along an "x" prober bar 430, it is understood that pogo pins would also be used for a "y" prober bar 420.

The pogo pins 480 are configured to place the frame 410 in electrical communication with selected pixels or TFT's (or other devices) formed on the substrate 150. The pogo pins 480, in turn, are in electrical communication with the controller via the frame pins 470. As the substrate 150 is urged against the prober 400 (shown in FIG. 3), electrical contact between the controller and the devices on the substrate 150 is made. This allows the controller to apply a voltage to a selected pixel or to monitor each pixel for changes in attributes, such as voltage, during testing.

In one test protocol, the substrate 150 is tested by sequentially impinging at least one electron beam emitted from columns 200 (shown in FIG. 3) on discrete portions or pixels composing the thin film transistor matrix. After the TFT's are tested, the substrate table 110 (with supported plates 120, 130) moves the substrate 150 to another discrete position within the testing chamber so that another pixel on the substrate 150 surface may be tested. Additional details concerning electron beam testing are provided in the referenced U.S. Pat. No. 6,833,717, which was previously incorporated by reference. However, it is noted that the present disclosure provides for a selectively configurable prober 400, rather than a fixed "picture frame" prober, as disclosed in FIG. 10A of the U.S. Pat. No. 6,833,717, which was previously incorporated by reference.

While the foregoing is directed to embodiments of the present invention, other and further embodiments of the invention may be devised without departing from the basic scope thereof. For example, the frame 410 may be provided of sufficient universal size to accommodate large area glass substrates of any dimension. When a user is faced with electron beam testing of a substrate having a different dimension or a different device layout, then the user may adjust the location of the bars 420 or 430 without having to purchase an entire new prober. Where additional bars are needed, then additional bars can be purchased at an expense that is much less than an entire new prober.

In addition, an electronic devices test system 100 has been described. The test system 100 is used to test electronic devices on a substrate, such as a glass substrate 150. The test system 100 utilizes a configurable prober 400 as described above in its various embodiments. The test system 100 includes both the prober 400 and the test system table 110. In one aspect, the test system 100 further has one or more electron beam columns.

A method for testing electronic devices is also provided. The method includes the steps of providing a test system table 110 in a test system 100; placing a "y" table 120 on the test system table 110, the "y" table 120 being selectively movable along the test system table 110 parallel to a "y" axis; placing an "x" table 130 on the "y" table 120, the "x" table 130 being selectively movable along the "y" table 120 parallel to an "x" axis; placing a configurable prober 400 on the "x" table 130; and placing a substrate 150 to be tested above the "x" table 130, the substrate 150 having contact pads (not visible) and a plurality of electronic devices (also not visible) in electrical communication with selected contact pads.

The prober 400 is in accordance with the prober 400 described above, in its various embodiments. Generally, the prober 400 has a frame 410, at least one prober bar 420 or 430 having a first end and a second end, a frame connection mechanism 412 that allows for ready relocation of the at least one prober bar 420 or 430 to the frame 410 at a selected coordinate along the frame 410, and a plurality of pogo pins 480 along the at least one prober bar 420 or 430 for placing selected electronic devices in electrical communication with a system controller during testing. In one aspect, the method further includes the step of placing at least some of the plurality of pogo pins 480 in electrical communication with the contact pads.

Preferably, the method further includes the step of placing a "z" plate 140 on the "x" plate 130. In this arrangement, the substrate 150 is placed on the "z" plate 140. In one embodiment, the method further includes the step of raising the "z" plate 140 in order to raise the substrate 150 and place the pogo pins 480 in electrical communication with the contact pads. Preferably, the substrate 150 is a glass plate, and each of the electronic devices is a thin film transistor.

The invention claimed is:

1. A method of testing electronic devices on substrates, sequentially comprising:
   placing a configurable prober over a first substrate;
   testing the first substrate;
   re-configuring the configurable prober based on a pattern of the electronic devices on a second substrate;
   placing the configurable prober over the second substrate; and then
   testing the second substrate, wherein:
      the configurable prober comprises a rectangular frame having a plurality of pogo pins disposed thereon; and
      the rectangular frame includes at least one prober bar movably coupled to the frame.

2. The method of claim 1, wherein the at least one prober bar is disposed between two opposing sides of the rectangular frame.

3. A method of testing electronic devices on substrates, sequentially comprising:
   placing a configurable prober over a first substrate;
   testing the first substrate;
   re-configuring the configurable prober based on a pattern of the electronic devices on a second substrate;
   placing the configurable prober over the second substrate; and then
   testing the second substrate, wherein each of the first and second substrates comprise a rectangular glass plate and each of the electronic devices is a thin film transistor.

4. A method of testing electronic devices on rectangular substrates, comprising:
   placing a configurable prober over a first rectangular substrate;
   adjusting the configurable prober based on a pattern of electronic devices on the first rectangular substrate;
   testing the first rectangular substrate;
   placing the configurable prober over a second rectangular substrate;

re-configuring the configurable prober by an adjustment based on a pattern of electronic devices on the second rectangular substrate; and testing the second rectangular substrate, wherein each of the first and second substrates comprise a rectangular glass plate and each of the electronic devices is a thin film transistor.

5. A method of testing electronic devices on substrates, sequentially comprising:

placing a configurable prober over a first substrate, the configurable prober comprising a rectangular frame having a plurality of pogo pins disposed thereon and the rectangular frame includes at least one prober bar movably coupled to the rectangular frame;

testing the first substrate;

re-configuring the configurable prober;

placing the configurable prober over a second substrate; and then testing the second substrate, wherein the at least one prober bar is disposed between two opposing sides of the rectangular frame.

* * * * *